(12) United States Patent
Farnworth et al.

(10) Patent No.: US 7,591,069 B2
(45) Date of Patent: *Sep. 22, 2009

(54) METHODS OF BONDING SOLDER BALLS TO BOND PADS ON A SUBSTRATE, AND BONDING FRAMES

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 152 days.

This patent is subject to a terminal disclaimer.

(21) Appl. No.: 10/930,236

(22) Filed: Aug. 30, 2004

(65) Prior Publication Data

US 2005/0023259 A1 Feb. 3, 2005

Related U.S. Application Data

(62) Division of application No. 10/303,141, filed on Nov. 23, 2002, now Pat. No. 6,857,183, which is a division of application No. 09/148,723, filed on Sep. 3, 1998, now Pat. No. 7,003,874.

(51) Int. Cl.
*H05K 3/34* (2006.01)
*B23K 26/08* (2006.01)

(52) U.S. Cl. .............................. 29/840; 29/843; 29/860; 219/121.78; 219/121.8

(58) Field of Classification Search .................. 29/840, 29/843, 860, 839, 740, 743, 739; 228/180.22, 228/245, 246, 40, 41; 219/121.63, 121.64, 219/85.12, 85.13, 121.78, 121.8; 174/263

See application file for complete search history.

(56) References Cited

U.S. PATENT DOCUMENTS 3,647,533 A 3/1972 Hicks 4,661,192 A 4/1987 McShane
4,831,724 A 5/1989 Elliott
4,871,110 A 10/1989 Fukasawa et al.

(Continued)

FOREIGN PATENT DOCUMENTS

| EP | 0 964 608 A2 | 12/1999 |
|---|---|---|
| JP | 8-118005 A | 5/1996 |
| JP | 9-51162 * | 2/1997 |
| NL | 1007949 | 1/1998 |
| WO | WO 98/12738 | 3/1998 |
| WO | WO 99/17593 | 4/1999 |

OTHER PUBLICATIONS

Kasulke et al., *Solder Ball Bumper (SBB)—A Flexible Equipment for FC, CSP, BGA and Printed Circuit Boards/An Innovative Solution for, Solder Application Solder Ball Bumper (SBB)*, Pac Tech Packaging Technologies GmbH and Fraunhofer IZM, pp. 1-8.

(Continued)

*Primary Examiner*—A. Dexter Tugbang
(74) *Attorney, Agent, or Firm*—Wells St. John P.S.

(57) ABSTRACT

Methods and apparatuses for bonding solder balls to bond pads are described. In one embodiment, portions of a plurality of solder balls are placed within a frame and in registered alignment with individual bond pads over a substrate. While the ball portions are within the frame, the balls are exposed to bonding conditions effective to bond the balls with their associated bond pads. In another embodiment, a frame is provided having a plurality of holes sized to receive individual solder balls. Individual balls are delivered into the holes from over the frame. The balls are placed into registered alignment with a plurality of individual bond pads over a substrate while the balls are in the holes. The balls are bonded with the individual associated bond pads.

14 Claims, 3 Drawing Sheets

U.S. PATENT DOCUMENTS

| | | | |
|---|---|---|---|
| 5,052,102 A | 10/1991 | Fong et al. | |
| 5,159,171 A | 10/1992 | Cook et al. | |
| 5,164,566 A | 11/1992 | Spletter et al. | |
| 5,219,117 A | 6/1993 | Lin | |
| 5,279,045 A | 1/1994 | Odashima et al. | |
| 5,297,333 A * | 3/1994 | Kusaka | 29/840 |
| 5,416,969 A * | 5/1995 | Miura | 29/860 X |
| 5,431,332 A | 7/1995 | Kirby et al. | |
| 5,479,703 A | 1/1996 | Desai et al. | |
| 5,495,089 A | 2/1996 | Freedman et al. | |
| 5,551,148 A | 9/1996 | Kazui et al. | |
| 5,620,927 A | 4/1997 | Lee | |
| 5,654,204 A | 8/1997 | Anderson | |
| 5,655,704 A | 8/1997 | Sakemi et al. | |
| 5,741,410 A | 4/1998 | Tsurushima | |
| 5,745,986 A | 5/1998 | Variot et al. | |
| 5,750,199 A | 5/1998 | Sakemi | |
| 5,762,258 A | 6/1998 | Le Coz et al. | |
| 5,763,854 A | 6/1998 | Dittman et al. | |
| 5,782,399 A | 7/1998 | Lapastora | |
| 5,839,641 A | 11/1998 | Teng | |
| 5,899,737 A | 5/1999 | Trabucco | |
| 5,941,449 A | 8/1999 | Le Coz et al. | |
| 5,977,512 A | 11/1999 | Azdasht et al. | |
| 6,056,190 A | 5/2000 | Foulke et al. | |
| 6,063,701 A | 5/2000 | Kuwazaki et al. | |
| 6,162,661 A | 12/2000 | Link | |
| 6,234,382 B1 | 5/2001 | Rischke et al. | |
| 6,268,275 B1 | 7/2001 | Cobbley et al. | |
| 6,412,685 B2 | 7/2002 | Hertz | |
| 2002/0040521 A1 | 4/2002 | Farnworth et al. | |

OTHER PUBLICATIONS

Yariv, Amnon; by John Wiley & Sons, Inc., "*Quantum Electronics—Second Edition*," 1967, 1975, pp. 176-193.

Eisberg, et al.,; by John Wile7 & Sons, Inc., "*Quantum Physicis of Atoms, Molecules, Solids, Nuclei, and Particles*," 1974, pp. 316.

Eisberg, et al,; by John Wiley & Sons, Inc., "*Quantum Physics of Atoms, Molecules, Solids, Nuclei and Particles*," 1974, pp. 425-433.

Yariv, Amnon; by John Wiley & Sons, Inc., "*Quantum Electronics—Second Edition*," 1967, 1975, pp. 300-307.

* cited by examiner

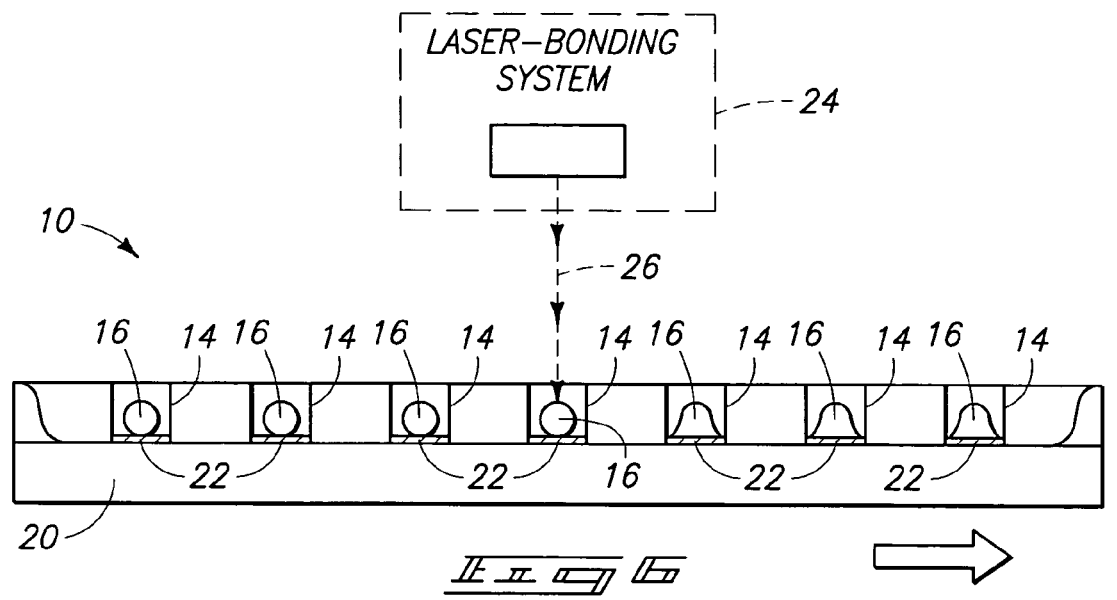
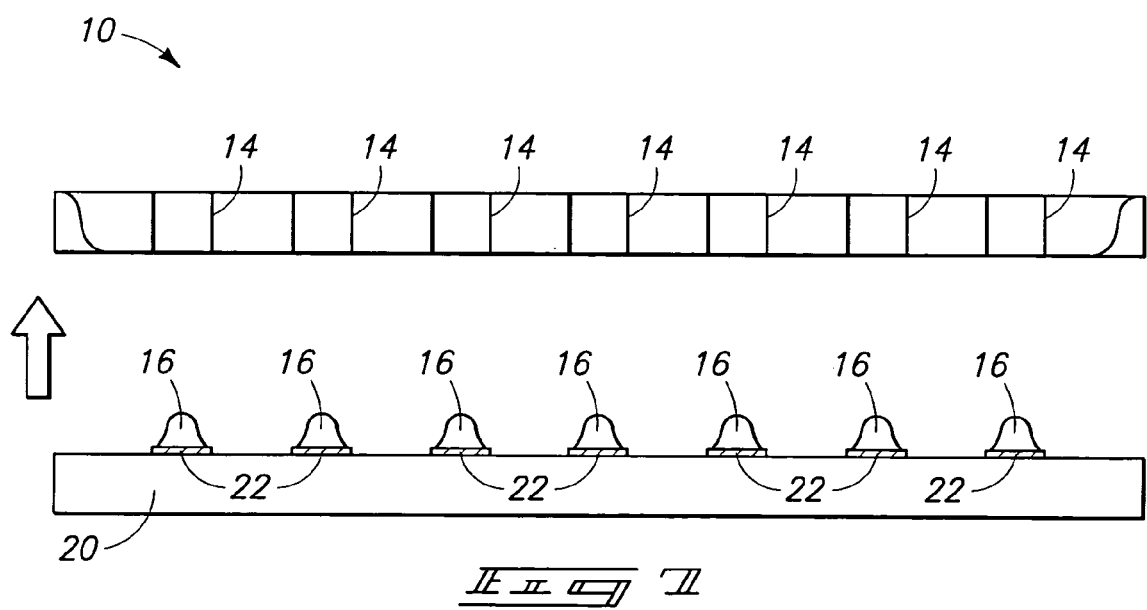

METHODS OF BONDING SOLDER BALLS TO BOND PADS ON A SUBSTRATE, AND BONDING FRAMES

RELATED PATENT DATA

This patent application is a divisional application of and claims priority to U.S. patent application Ser. No. 10/303,141, filed Nov. 23, 2002, now U.S. Pat. No. 6,857,183, issued Feb. 22, 2005, entitled "Methods of Bonding Solder Balls to Bond Pads on a Substrate," naming Warren M. Farnworth and Alan G. Wood as inventors, which is a divisional application of U.S. patent application Ser. No. 09/148,723, filed Sep. 3, 1998, now U.S. Pat. No. 7,003,874, issued Feb. 28, 2006, the disclosures of which are incorporated herein by reference.

TECHNICAL FIELD

The present invention relates to methods of bonding solder balls to bond pads on a substrate, and to bonding frames.

BACKGROUND OF THE INVENTION

As integrated circuitry becomes smaller and more dense, needs arise relative to the packaging and interconnecting of fabricated integrated circuitry devices. Concerns associated with increasing the speed with which integrated circuitry devices are packaged and the efficiency with which the devices are packaged drive the industry to find faster and more flexible systems and methods for packaging integrated circuitry. Specifically, one aspect of integrated circuitry packaging includes bonding conductive balls or solder balls on bond pads of a substrate for subsequent connection to packaging structure. Such is commonly referred to as solder ball bumping.

In the formation of solder-bumped substrates, solder ball material is provided over bond pads of a substrate supporting integrated circuitry thereon. If the substrates are to be flip-chip bonded to another substrate, it is important that the solder balls be of uniform size. Otherwise, some of the balls might not make desirable contact with the bond pads of the substrate to which it is to be bonded. This problem led to development of pre-formed solder balls which are formed to a specific common tolerance dimension such that all of the solder balls are essentially the same size. Hence, when the solder balls are bonded by solder melting/welding to substrates, each will essentially project from the outer substrate surface a common distance and accordingly make contact with all bond pads when being bonded.

This invention arose out of concerns associated with providing improved methods and apparatuses for packaging integrated circuitry.

SUMMARY OF THE INVENTION

Methods and apparatuses for bonding solder balls to bond pads are described. In one embodiment, portions of a plurality of solder balls are placed within a frame and in registered alignment with individual bond pads over a substrate. While the ball portions are within the frame, the balls are exposed to bonding conditions effective to bond the balls with their associated bond pads. In another embodiment, a frame is provided having a plurality of holes sized to receive individual solder balls. Individual balls are delivered into the holes from over the frame. The balls are placed into registered alignment with a plurality of individual bond pads over a substrate while the balls are in the holes. The balls are bonded with the individual associated bond pads. In another embodiment, a frame is provided having a hole. A solder ball is provided having an outer surface. The solder ball is retained within the hole in an ambient processing environment which is generally uniform over the entirety of the ball's outer surface. While the solder ball is within the hole, the solder ball is bonded with an associated bond pad on a substrate.

BRIEF DESCRIPTION OF THE DRAWINGS

Preferred embodiments of the invention are described below with reference to the following accompanying drawings.

FIG. 6 is a view of the FIG. 4 frame undergoing processing in accordance with one embodiment of the invention.

FIG. 7 is a view of the FIG. 4 frame and substrate after the solder balls have been bonded with their individual associated bond pads.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
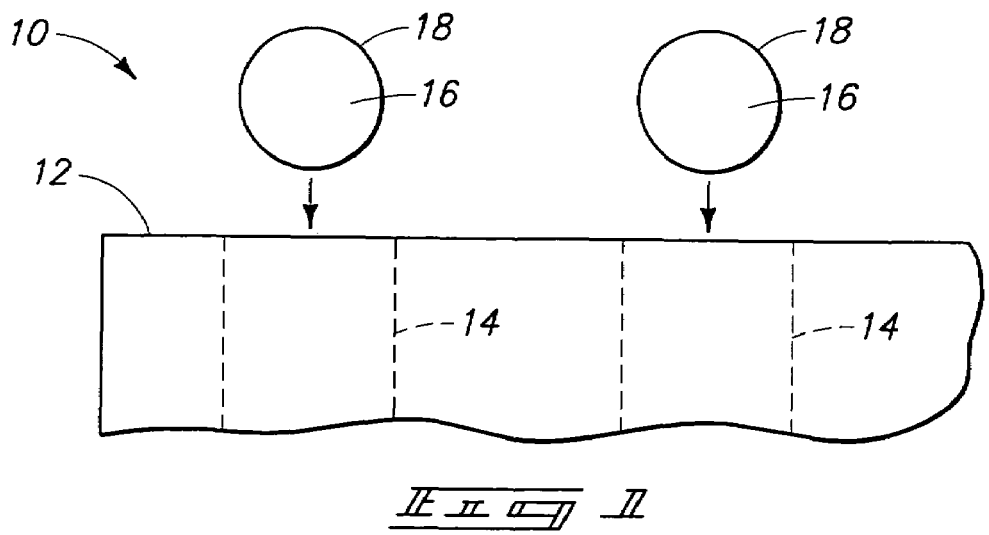
FIG. 1 is a side elevational view of a portion of a frame which is disposed in a position to receive one or more solder balls in accordance with one or more embodiments of the present invention.

Referring to FIG. 1, a portion of a frame in accordance with one embodiment of the invention is shown generally at 10 and includes an outer surface 12 having at least one, and preferably a plurality of holes 14 therein. Holes 14 are preferably sized to receive individual solder balls 16 having individual solder ball outer surfaces 18. In one embodiment, the frame and holes are dimensioned to permit one and only one solder ball to be received within each hole at a time. In a preferred embodiment, a majority portion of an associated solder ball is received within each hole.

Figure 2:
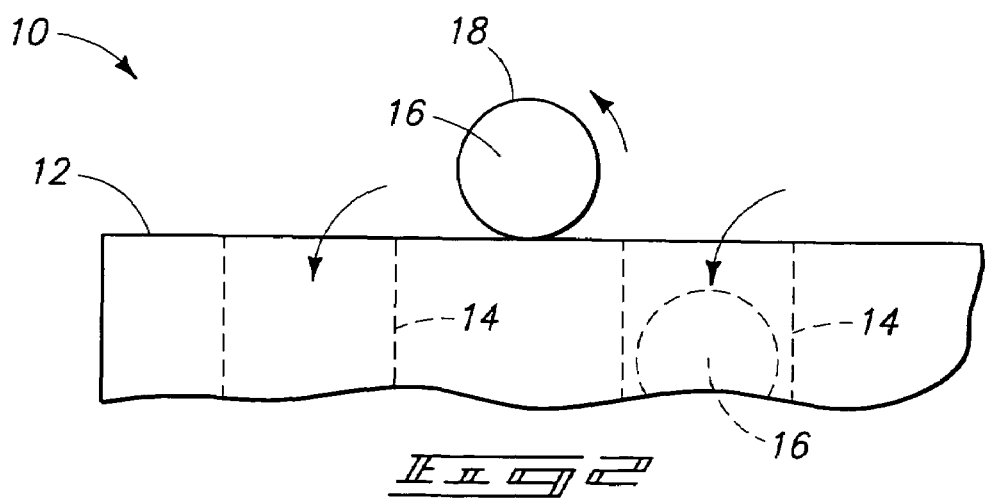
FIG. 2 is a side elevational view of a portion of a frame which is disposed in a position to receive one or more solder balls in accordance with one or more embodiments of the present invention.

The solder balls can be provided into frame-supported positions in a variety of ways. In one embodiment, individual solder balls 16 are delivered into holes 14 from over frame 10, as FIG. 1 implies. In another embodiment (FIG. 2) a plurality of solder balls 16 are provided over surface 12, at least some of which being deposited into at least some of holes 14. The balls can be provided over the surface in any manner. In the illustrated example, balls 16 are provided over surface 12 by rolling at least one, and preferably a plurality of the balls over the surface and into individual respective holes 14. The balls can be rolled over the frame surface until individual balls drop into individual associated holes. Alternately considered, frame 10 positioned in proximity to a substrate (not shown) to which conductive balls are to be bonded can be dipped into a volume of balls. Thereafter, the frame and substrate are removed from the volume of balls, with individual balls be received in respective frame holes. The balls are preferably small enough to pass through the holes.

Figure 3:
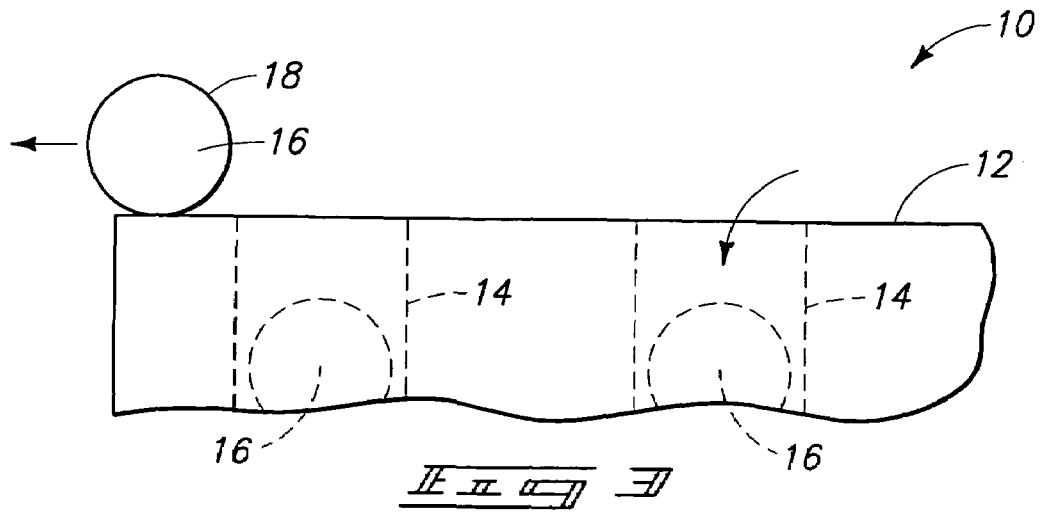
FIG. 3 is a side elevational view of a portion of a frame which is disposed in a position to receive one or more solder balls in accordance with one or more embodiments of the present invention.

Referring to FIG. 3, and in accordance with another embodiment of the invention, more solder balls 16 are provided than there are holes in outer surface 12. In this example, three solder balls 16 are provided for the two illustrated holes 14. One of the balls and the frame is moved relative to the other of the balls and the frame effective to deposit a ball into each hole. In this example, balls 16 are moved over surface 12 effective to deposit one solder ball into each hole. Excess solder balls, such as the leftmost solder ball 16, which were not deposited into a hole are removed from over surface 12. Removal of excess balls can be effected in any suitable way. Alternately considered, frame 10 positioned in proximity to a substrate (not shown) to which conductive balls are to be bonded can be dipped into a volume of balls. Thereafter, the frame and substrate are removed from the volume of balls, with individual balls be received in respective frame holes.

Figure 4:
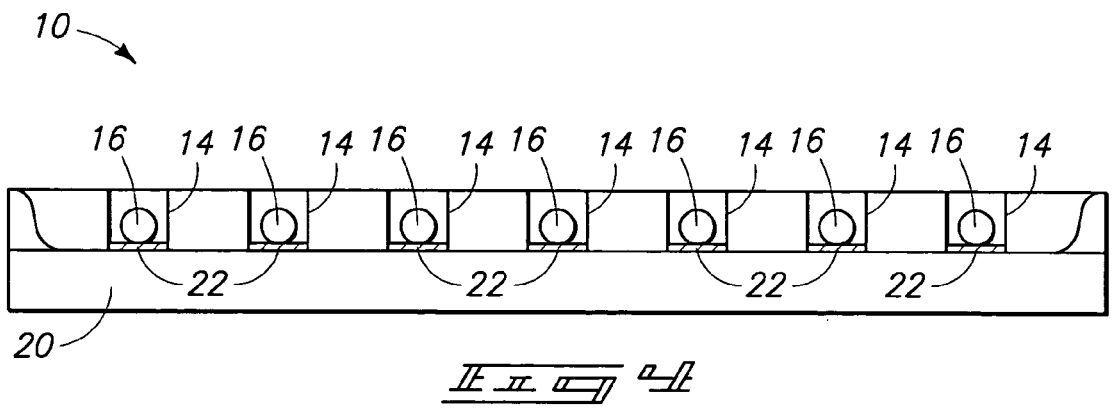
FIG. 4 is a side elevational view of a frame engaged with a substrate in accordance with one or more embodiments of the invention. A portion of the frame has been broken away to show detail.

Referring to FIG. 4, frame 10 is shown in proximity with a substrate 20 having thereon a plurality of bond pads 22. Holes 14 hold one individual solder ball respectively, in registered alignment with an associated bond pad 22 on substrate 20. In one embodiment, each solder ball 16 is placed on a fluxless bond pad surface. Fluxless bond pad surfaces are preferably used in this embodiment because the frame maintains each individual solder ball in registered alignment with an associated bond pad prior to and during solder ball bonding described below. This embodiment can overcome some problems presented through the use of flux on bond pads. Specifically, flux will typically have to be completely cleaned from a substrate after the bonding process. This embodiment can permit the post-bonding cleaning step to be eliminated thereby simplifying the bonding process.

This embodiment also permits at least two solder balls 16 to be contemporaneously retained over different respective bond pads on substrate 20. In a preferred embodiment, frame 10 is moved to proximate substrate 20 before any of the balls are delivered into the holes. Subsequently, individual balls can be provided or delivered into the holes as described above.

In another embodiment, the solder balls are retained within each hole in an ambient processing environment which is generally uniform over the entirety of each ball's outer surface 18. Specifically, while each ball is retained within its associated hole and in registered alignment with an associated bond pad, the processing environment outwardly of each ball is generally uniform. That is, retaining each ball within its respective hole can take place without the use of any outside environment-changing conditions such as vacuum pressure and the like on only a portion of the respective balls. The balls are preferably inserted into their associated hole from a position within the ambient processing environment without separately and discretely providing a vacuum force against only portions of each ball during bonding. Such non-vacuum retention provides more flexibility and increases the simplicity-with which the balls can be processed.

Once having been placed in proximity with their individual associated bond pads, the individual solder balls can be bonded with their bond pads. The balls can be bonded separately, or can be bonded all at once as through suitable heat processing. Such can take place in any suitable manner, with but two examples being described below in connection with FIGS. 5 and 6.

Figure 5:
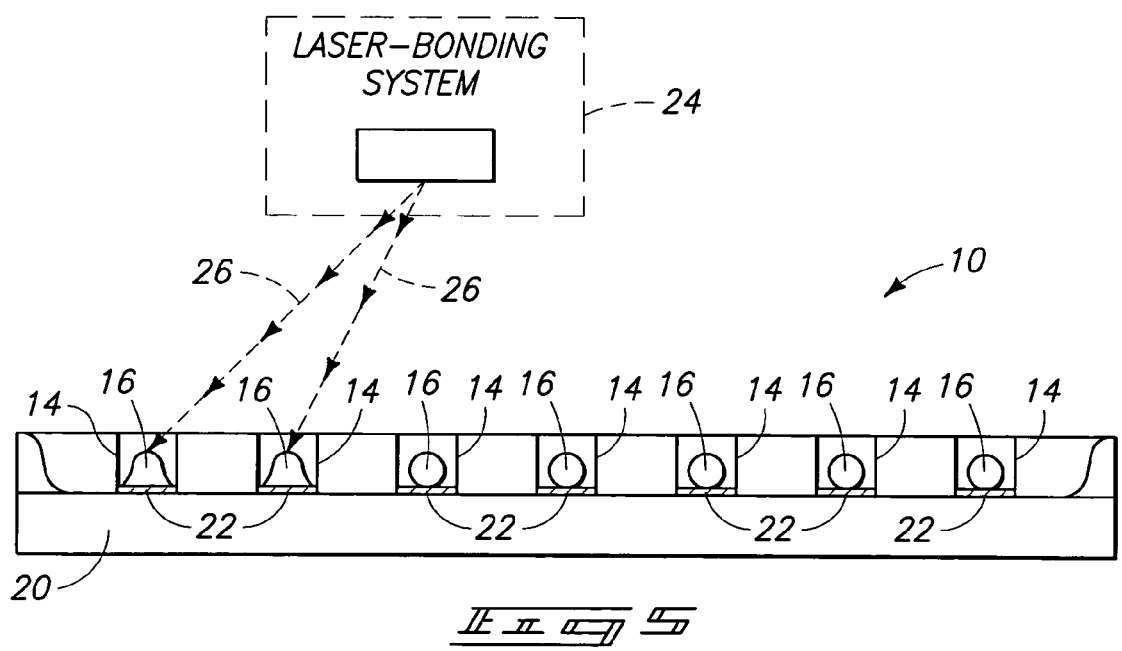
FIG. 5 is a view of the FIG. 4 frame undergoing processing in accordance with one embodiment of the invention.

Referring to FIGS. 5 and 6, solder balls 16 are exposed to bonding conditions effective to bond the balls with their associated bond pads 22. In one embodiment, the solder balls are reflowed under such bonding conditions while they are within their individual holes. For example, the two leftmost balls in FIG. 5 and the three rightmost balls in FIG. 6 are seen to have been reflowed while within their individual holes. In a preferred embodiment, a laser-bonding system 24 is provided and solder balls 16 are laser-bonded with their associated bond pads.

In one laser-bonding embodiment (FIG. 5), laser bonding is effected by fixing the position of frame 10 and moving a laser beam 26 relative to the frame from ball-to-ball. In this way, a laser beam is moved relative to and between individual balls to engage each ball.

In another laser-bonding embodiment (FIG. 6), laser bonding is effectuated by fixing the position of a laser beam 26 and moving frame 10 relative to the laser beam from ball-to-ball. In this example, frame 10 is moved in the direction of the arrow immediately below substrate 20. Accordingly, the three rightmost solder balls 16 have been reflowed by laser 26 while the four leftmost solder balls remain to be processed. Such comprises moving individual solder balls relative to a generally-fixed laser beam.

Referring to FIG. 7, frame 10 is moved away from proximity with substrate 20. Preferably, frame 10 is moved away from substrate 20 after individual solder balls are exposed to the bonding conditions. In this example, the holes are preferably dimensioned so that they do not overly restrict removal of the frame after the balls are reflowed. Accordingly, such comprises removing individual holes from around their associated reflowed balls. Of course, the frame could be moved away from the substrate prior to the exposure of the balls to the bonding conditions, particularly if flux or some other agent or means is used to retain the balls on their pads during bonding.

In another aspect of the invention, a frame is provided having a plurality of ball-supporting features which maintain at least two balls in registered alignment with a substrate having bond pads thereon. In a preferred embodiment, the ball-supporting features comprise individual holes which extend through the frame and which are dimensioned to receive only one ball at a time. The holes are preferably disposed over the frame in a template-like orientation which matches the orientation of bond pads with which the solder balls are desired to be bonded. The inventive frames can enable a large number of solder balls to be simultaneously placed into bond pad-engaging positions where they can be subsequently bonded in a time-saving fashion.

Aspects of the invention enable solder balls to be placed with greater precision and in greater numbers than was previously possible. Such enables throughput to be increased and provides for better integrated circuitry packaging uniformity. In addition, solders balls can be placed and bonded in greater numbers on fluxless bond pads which can increase throughput by expediting processing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A fluxless solder ball bonding method, comprising:
providing a frame;
providing a substrate comprising a plurality of individual bond pads;
placing at least portions of respective ones of a plurality of balls of solder within the frame and in registered alignment with respective ones of the individual bond pads;
while the ball portions are within the frame, moving a beam of directional bonding energy relative to the frame, and bonding respective ones of the plurality of balls of solder to the respective ones of the individual bond pads using the beam of directional bonding energy; and
wherein the step of placing further comprises immersing the frame into a volume of the plurality of balls of solder.

2. The method of claim 1, wherein the beam of directional bonding energy comprises a laser beam.

3. The method of claim 1, wherein the beam of directional bonding energy comprises a laser beam, and wherein the bonding comprises laser bonding the respective ones of the plurality of balls of solder to the respective individual bond pads by moving the laser beam relative to the frame.

4. The method of claim 1, wherein the immersing comprises immersing an entirety of the frame into the volume of the plurality of balls of solder.

5. The method of claim 1, wherein the immersing comprises immersing the frame and substrate into the volume of the plurality of balls of solder.

6. The method of claim 1, wherein the immersing comprises immersing an entirety of the frame and an entirety of the substrate into the volume of the plurality of balls of solder.

7. The method of claim 1, wherein the bonding comprises the respective individual bond pads being devoid of flux.

8. The method of claim 1, wherein the frame is stationary during the bonding.

9. The method of claim 1, wherein the moving comprises moving a laser beam.

10. The method of claim 1, wherein the moving comprises moving a laser beam using a solder bonding device located at a fixed position.

11. A fluxless solder ball bonding method, comprising:
affixing a frame to a location in space;
placing at least portions of a plurality of balls of solder within the frame and in registered alignment with respective individual bond pads over a substrate;
while the ball portions are within the frame and the frame remains at the location in space, bonding the plurality of balls of solder to the respective individual bond pads; and
wherein the step of placing further comprises immersing the frame into a volume of the plurality of balls of solder.

12. The method of claim 11, wherein the bonding comprises laser bonding the respective ones of the plurality of balls of solder to the respective individual bond pads by moving a laser device relative the frame.

13. The method of claim 11, wherein the immersing comprises immersing an entirety of the frame into the volume of the plurality of balls of solder.

14. The method of claim 11, wherein the bonding comprises the respective individual bond pads being devoid of flux.

* * * * *

UNITED STATES PATENT AND TRADEMARK OFFICE
CERTIFICATE OF CORRECTION

PATENT NO. : 7,591,069 B2  Page 1 of 1
APPLICATION NO. : 10/930236
DATED : September 22, 2009
INVENTOR(S) : Farnworth et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 337 days.

Signed and Sealed this

Twenty-first Day of September, 2010

David J. Kappos
*Director of the United States Patent and Trademark Office*